US011576278B2

(12) United States Patent
Yow et al.

(10) Patent No.: US 11,576,278 B2
(45) Date of Patent: Feb. 7, 2023

(54) DUAL-SIDED FAN TRAY ASSEMBLY OF AN ELECTRONIC SYSTEM

(71) Applicant: Hewlett Packard Enterprise Development LP, Houston, TX (US)

(72) Inventors: See Yun Yow, Singapore (SG); Hong Yi Wee, Singapore (SG); Kelly Khe Liq Khoo, Singapore (SG)

(73) Assignee: Hewlett Packard Enterprise Development LP, Spring, TX (US)

( * ) Notice: Subject to any disclaimer, the term of this patent is extended or adjusted under 35 U.S.C. 154(b) by 127 days.

(21) Appl. No.: 17/248,085

(22) Filed: Jan. 8, 2021

(65) Prior Publication Data
US 2022/0225535 A1 Jul. 14, 2022

(51) Int. Cl.
*H05K 7/20* (2006.01)

(52) U.S. Cl.
CPC .............................. *H05K 7/20172* (2013.01)

(58) Field of Classification Search
CPC ........................ H05K 7/20172; Y10T 70/5765
See application file for complete search history.

(56) References Cited

U.S. PATENT DOCUMENTS

| 5,562,410 | A |   | 10/1996 | Sachs et al. |
| 6,134,115 | A | * | 10/2000 | Sim .................... G06F 1/184 361/728 |
| 7,983,039 | B1 |   | 7/2011 | Nguyen et al. |
| 8,068,340 | B1 |   | 11/2011 | Nguyen et al. |
| 8,320,120 | B1 |   | 11/2012 | Chan et al. |
| 9,173,326 | B1 |   | 10/2015 | Smith et al. |
| 9,920,772 | B2 |   | 3/2018 | Wilcox et al. |
| 2013/0155609 | A1 | * | 6/2013 | Kuo .................... G06F 1/20 361/679.48 |

OTHER PUBLICATIONS

Arista.com; "Fan Module Orientation"; printed from webpage: https://www.arista.com/en/qsg-7010-series-1ru/7010-series-1ru-appendix-a-fan-module-orientation; 2020; 3 pages.

* cited by examiner

*Primary Examiner* — Mukundbhai G Patel
(74) *Attorney, Agent, or Firm* — Hewlett Packard Enterprise Patent Department (57) ABSTRACT

Example implementations relate to a dual-sided fan tray assembly of an electronic system. The fan tray assembly includes a housing having a front panel, a back panel, and a pair of side walls coupled to the front and back panels. The fan tray assembly further includes a handle assembly pivotably connected to the pair of side walls such that the handle assembly is at least rotatable around the housing to at least first and second positions spaced apart from each other. When the handle assembly is rotated to the first position, the fan tray assembly is slidably insertable into a chassis of an electronic system with the front panel facing the chassis to install the fan tray assembly to the electronic system. When the handle assembly is rotated to the second position, the fan tray assembly is slidably insertable into the chassis with the back panel facing the chassis.

19 Claims, 9 Drawing Sheets

DUAL-SIDED FAN TRAY ASSEMBLY OF AN ELECTRONIC SYSTEM

BACKGROUND

Electronic systems, for example, a server system or a switch system may include a fan tray assembly having a plurality of fans to supply coolant air for dissipating a waste-heat from an interior of the electronic system. Typically, many of the various electronic devices disposed within the electronic system generates the waste-heat while operating. For example, the electronic devices, such as power supply units, hard drives, circuit boards of the electronic system may generate the waste-heat. To avoid overheating of the electronic devices, the plurality of fans may either draw the coolant air and/or blow the coolant air over such electronic devices. Thus, the coolant airflow generated by the plurality of fans may provide forced convection that may transfer the waste-heat from the electronic devices to the coolant air, thereby generating a heated air. Normally, the heated air exits the interior of the electronic system via a front panel or a back panel of the electronic system.

BRIEF DESCRIPTION OF THE DRAWINGS

Various examples will be described below with reference to the following figures.

DETAILED DESCRIPTION

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "electronic system" may refer to a type of a computing system, such as a server system, a storage system, a power conversion system, or a networking system, having a receptacle for receiving a dual-sided fan tray assembly. The term "receptacle" may refer to a hollow object/space of the chassis for receiving and containing the dual-sided fan tray assembly therein. As used herein, the term "dual-sided fan tray assembly" may refer to a type of a connectable electronic assembly i) which may be installed through one of a front panel or a back panel of the electronic assembly, ii) which is not native to the electronic system, or iii) which is ancillary to the electronic system, and iv) may have to be installed to the electronic system by way of slidably inserting into the receptacle of a chassis in the electronic system, for providing a coolant air to the electronic system. The term "front panel" of the dual-sided fan tray assembly may refer to a) a side that is disposed outside or facing away from the chassis, when a plurality of fans of the dual-sided fan tray assembly is configured for blowing of the coolant air from an external environment into an interior space of an electronic system or b) the side that is disposed inside or facing the chassis, when the plurality of fans is configured for suction of the coolant air from the interior space of the electronic system to the external environment. Similarly, the term "back panel" of the dual-sided fan tray assembly may refer to a) another side (i.e., mutually opposite side of the front side) that is disposed outside or facing away from the chassis, when the plurality of fans is configured for suction of the coolant air from the interior space of the electronic system to the external environment or b) the other side that is disposed inside or facing the chassis, when the plurality of fans is configured for blowing of the coolant air from the external environment into the interior space of the electronic system. As used herein, the term "longitudinal axis" mat refer to a path or a direction along which the coolant air flows through the electronic system in order to cool the electronic devices of the electronic system. In other words, the term "longitudinal axis" may refer to the direction along which a majority of the coolant air flows through the electronic system. The term "lateral axis" may refer to i) a direction that is perpendicular to the longitudinal axis, or ii) the direction that is perpendicular to the flow of the majority of the coolant air through the electronic system. Further, the term "a central axis of rotation of a pivot pin" may refer to i) an axis extending parallel to the lateral axis and/or ii) the axis extending between a pair of pivot pins disposed on a pair of side walls of a housing.

The present disclosure describes example implementations of a dual-sided fan tray assembly for an electronic system for providing a thermal management solution to the electronic system. In some example, the dual-sided fan tray assembly may be installed into a chassis of the electronic system, through any one of the dual-sides (i.e., a front panel or a back panel) of the fan tray assembly to provide the thermal management solution to the electronic system, which is capable of supporting operations in dual directions. Further, based on the installation of the dual-sided fan tray assembly, a plurality of fans of the assembly may be either operated as a blower or a suction fan for providing thermal management solution to the electronic system capable of supporting operations in the dual directions.

For purposes of explanation, certain examples are described with reference to the components illustrated in FIGS. 1-6. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIGS. 5A-5H and 6A-6L are an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

During operation of the electronic system, for example, a switch system having a plurality of network connector sockets and electronic devices, may generate a considerable amount of waste-heat that needs to be removed in order to improve the performance, reliability, or life expectancy of the switch system. In such examples, a conventional fan tray assembly having a plurality of fans may be installed into a chassis of the electronic system to either blow a coolant air or suction of the coolant air so as to dissipate the waste-heat from an interior of the electronic system. However, for the switch system that may be capable of supporting the operations in dual directions (i.e., having the plurality of network connector sockets on both first and second panels of the electronic system, for connecting to destination devices to receive and forward data there between), the conventional fan tray assembly cannot be used for providing the thermal management solution. Because, the conventional fan tray assembly cannot be re-oriented and installed into the electronic system for reversing the function (blowing or suction of the coolant air) of the plurality of fans. Hence, the electronic system having the capability to support operations in the dual directions, may require to have two different fan tray assemblies, which can be installed through any one of the two different directions to provide the thermal management solution to the electronic system. Thus, resulting in causing inconvenience and cost escalations to the users.

A technical solution to the aforementioned problems may include providing a dual-sided fan tray assembly which may be installed from any one of the dual-sides into a chassis of the electronic system to provide a thermal management solution. For example, the dual-sided fan tray assembly may include a pivotably connected handle assembly, which may be rotated from about "0" degrees to about "−180" degrees relative to a central axis of rotation of a pivot pin, to enable installation of the dual-sided fan tray assembly through one of the front panel or the back panel, into the chassis of the electronic system. It may be noted herein that the central axis of rotation of the pivot pin may refer to an axis which orients parallel to the lateral axis and extends between the pair of pivot pins. In some examples, when the handle assembly is rotated to a first position (i.e., substantially about "0" degrees relative to the central axis of rotation of the pivot pin), the dual-sided fan tray assembly may be slidably insertable into the chassis with the front panel facing the chassis to install the dual-sided fan tray assembly to the electronic system. In such examples, a first connector of the dual-sided fan tray is connected to the third connector of the electronic system to allow a plurality of fans of the dual-sided fan assembly, for suction of the coolant air from the interior space of the electronic system to the external environment via the front panel and the back panel, sequentially to provide a thermal management solution to the electronic system. In some other examples, when the handle assembly is rotated to a second position (i.e., substantially about "−180" degrees relative to the central axis of rotation of the pivot pin), the dual-sided fan tray assembly may be slidably insertable into the chassis of the electronic system with the back panel facing the chassis to install the dual-sided fan tray assembly to the electronic system. In such examples, a second connector of the dual-sided fan tray is connected to the third connector of the electronic system to allow the plurality of fans for blowing the coolant air from the external environment into the interior space of the electronic system via the front panel and the back panel, sequentially to provide the thermal management solution to the electronic system.

Accordingly, in one or more examples of the present disclosure an electronic system having a dual-sided fan tray assembly is used for providing a thermal solution to the electronic system. The dual-sided fan tray assembly includes a housing having a front panel, a back panel, and a pair of side walls coupled to the front and back panels. The dual-sided fan tray assembly further includes a handle assembly pivotably connected to the pair of side walls such that the handle assembly is at least rotatable (i.e., substantially between "0" degrees to "−180" degrees relative to a central axis of rotation of the pivot pin) around the housing to at least first and second positions, which are spaced apart from each other. When the handle assembly is rotated to the first position, the dual-sided fan tray assembly is slidably insertable into a chassis of an electronic system with the front panel facing the chassis to install the dual-sided fan tray assembly to the electronic system. When the handle assembly is rotated to the second position, the dual-sided fan tray assembly is slidably insertable into the chassis with the back panel facing the chassis to install the dual-sided fan tray assembly to the electronic system.

Figures 1A, 1B:
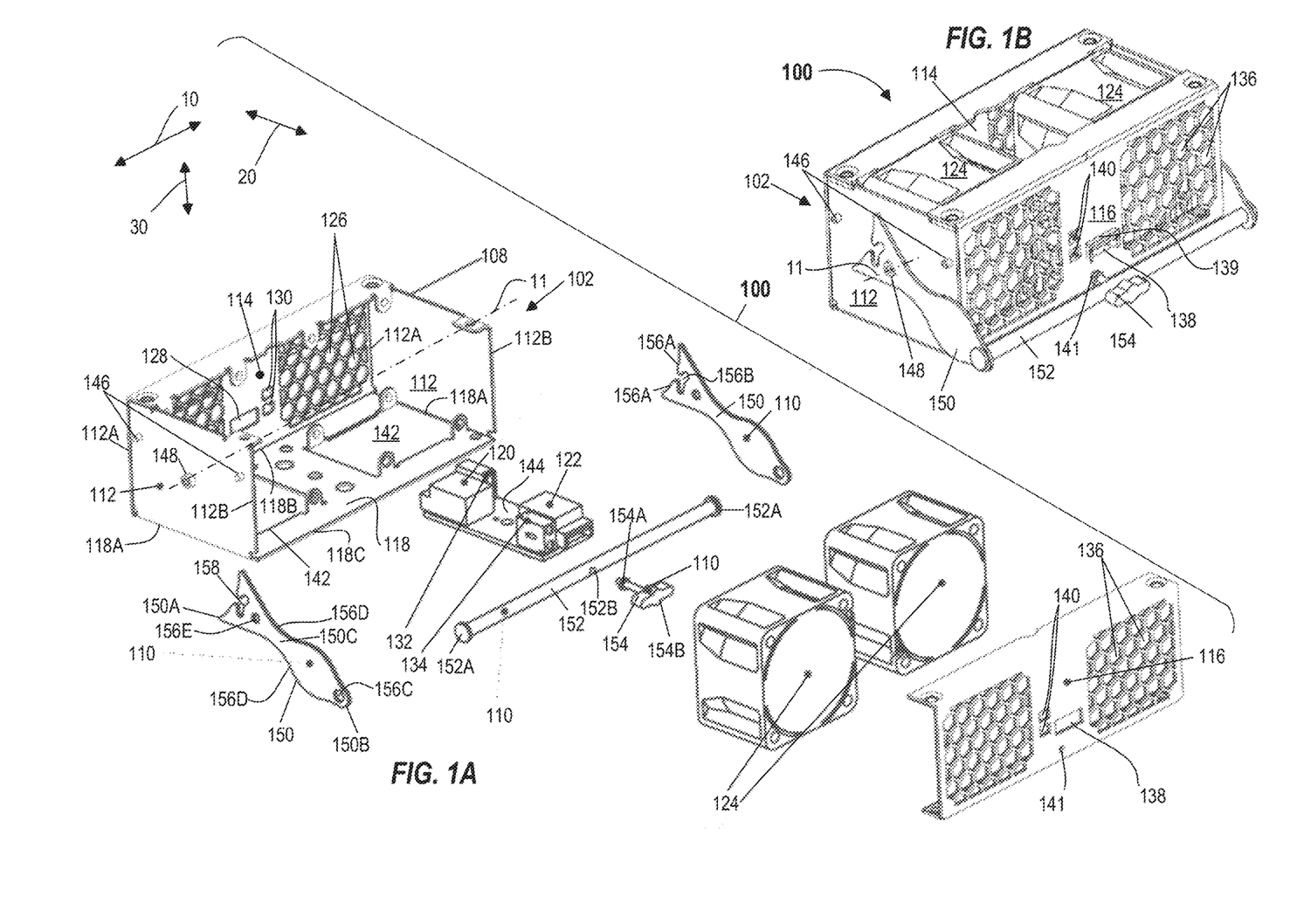
FIG. 1A illustrates an exploded perspective view of a portion of an electronic system having a dual-sided fan tray assembly according to an example implementation of the present disclosure.
FIG. 1B illustrates an assembled perspective view of the dual-sided fan tray assembly of FIG. 1A according to an example implementation of the present disclosure.

FIG. 1A depicts an exploded perspective view of a portion of an electronic system 100 having a dual-sided fan tray assembly 102. FIG. 1B depicts an assembled perspective view of the dual-sided fan tray assembly 102 of FIG. 1A. In some examples, the electronic system 100 may be a compute infrastructure, such as a server system, a storage system, a power conversion system, a networking system, or the like. In the example of FIGS. 1A and 1B, the electronic system 100 is the networking system, such as a switch system, which may be configured to connect electronic devices (not shown in FIGS. 1A and 1B) in the electronic system 100 by using packet switching to receive and forward data to destination devices. The dual-sided fan tray assembly 102 may function as a removable device, which may be detachably coupled to a chassis (not shown in FIGS. 1A and 1B) of the electronic system 100, and may be used for providing a thermal management solution, for example, a coolant air to dissipate a waste-heat generated by the electronic devices in the electronic system 100. In one or more examples, the dual-sided fan tray assembly 102 includes a housing 108 and a handle assembly 110.

In some examples, the housing 108 includes a pair of side walls 112, a front panel 114, a back panel 116, a base 118, and a top cover (not shown in FIGS. 1A and 1B) that may be disposed over tray components, such as a first connector 120, a second connector 122, and a plurality of fans 124 of the dual-sided fan tray assembly 102, and coupled to the pair of side walls 112, the front panel 114, and the back panel 116. In the example of FIGS. 1A and 1B, the pair of side walls 112 are spaced apart from one another along a lateral axis 10, and disposed parallel to one other. The pair of side walls 112 extends along a longitudinal axis 20 of the electronic system 100, and coupled to peripheral sides 118A of the base 118. Further, each side wall of the pair of side wads 112 includes a pair of stopper pins 146 and a pivot pin 148. In the example of FIGS. 1A and 1B, the pair of stoppers pins 146 and the pivot pin 148 are visible in only one side wall of the pair of side walls 112. In some examples, the pivot pin 148 is disposed at a center of the side wall 112, and the pair of stopper pins 146 are disposed spaced apart from each other along the longitudinal axis 20, and positioned above the pivot pin 148. Further, each stopper pin of the pair of stopper pins 146 and the pivot pin 148 may extend outwards relative to the housing 108 along the lateral axis 10. In some examples, the pair of stopper pins 146 and the pivot pin 148 may be coupled to each side wall 112, via suitable coupling mechanism, such as riveting, welding, fasteners, or the like. In some other examples, the pair of stopper pins 146 and the pivot pin 148 may be merged to each side wall 112 to form an integrated side wall 112. In some examples, the pair of side walls 112 may be made of a sheet metal.

The front panel 114 is disposed at a front side of the dual-sided fan tray assembly 102, and extends along the lateral axis 10 of the electronic system 100. In such examples, the front panel 114 is further coupled to front ends 112A of the pair of side walls 112, and a front end 118B of the base 118. In one or more examples, the front panel 114 may have a "U" shaped structure, and may be made of a sheet metal. The front panel 114 includes a plurality of first perforations 126, a first connector cut-out 128, a pair of first light emitting diode (LED) cut-outs 130, and a first threaded recess (not shown in FIGS. 1A and 1B). The plurality of first perforations 126 may allow a flow of the coolant air to pass through it. The first connector cut-out 128 may have a protective cover (not shown in FIGS. 1A and 1B) to prevent a direct exposure of the first connector 120 to an external environment. In some examples, each of the first and second connectors 120, 122 respectively is a female connector socket, for example, a peripheral component interconnect express (PCIe) connector socket.

The back panel 116 is disposed at a back side of the dual-sided fan tray assembly 102, and extends along the lateral axis 10 of the electronic system 100. In such examples, the back panel 116 is further coupled to back ends 112B of the pair of side walls 112, and a back end 118C of the base 118. As discussed hereinabove, the back panel 116 may also have a "U" shaped structure, and may be made of a sheet metal. The back panel 116 includes a plurality of second perforations 136, a second connector cut-out 138, a pair of second LED cut-outs 140, and a second threaded recess 141. The plurality of second perforations 136 may also allow a flow of the coolant air to pass through it. The second connector cut-out 138 may have another protective cover 139 to prevent a direct exposure of the second connector 122 to the external environment.

It may be noted herein that the front panel 114 and the back panel 116 may have different color codes or indexes to allow an user to identify a side of the dual-sided fan tray assembly 102, which faces the chassis of the electronic system 100, when the dual-sided fan tray assembly 102 is slidably inserted into the chassis of the electronic system 100 for installing to the electronic system 100.

In one or more examples, the base 118, the front panel 114, the pair of side walls 112, and the back panel 116 are coupled to one another, as discussed hereinabove, to form an enclosure of the housing 108. In such examples, the tray components, such as the plurality of fans 124, the first connector 120, the second connector 122, a first LED 132, and a second LED 134 may be disposed within the enclosure to define the housing 108 of the dual-sided fan tray assembly 102. For example, the plurality of fans 124 may be coupled to the base 118 via a pair of clamps 142. Similarly, the first and second connectors 120, 122 respectively, may be disposed back-to-back and coupled to a circuit board 144 of the dual-sided fan tray assembly 102. The first and second LEDs 132, 134 respectively, are disposed adjacent to the first and second connectors 120, 122 respectively, and coupled to the circuit board 144. In such examples, the circuit board 144 may be further coupled to the base 118. In one or more examples, when the first and second connectors 120, 122 respectively, are disposed within the housing 108 and coupled to the base 118, the first and second connectors 120, 122 may face the respective first and second connector cut-outs 128, 138. Similarly, the first and second LEDs 132, 134 may also face the respective first and second LED cut-outs 130, 140.

As shown in FIGS. 1A and 1B, the handle assembly 110 includes a pair of levers 150, a grip rod 152, and a knob 154. The pair of levers 150 are disposed spaced apart from each other along the lateral axis 10 and disposed parallel to each other. The pair of levers 150 is pivotably connected to a corresponding side wall of the pair of side walls 112. Each lever of the pair of levers 150 includes a first end 150A, a second end 150B, and a body 150C interconnecting the first and second ends 150A, 150B respectively. In some examples, the first end 150A has a pair of symmetrically curved surfaces 156A (also referred to as a pair of first symmetrically curved surfaces), and a curved elongated opening 156B located there between separating the pair of first symmetrically curved surfaces 156A. Even though not illustrated in FIGS. 1A and 1B, the pair of levers 150 includes a pair of curved elongated openings 156B. In the example of FIGS. 1A and 1B, each curved surface of the pair of first symmetrically curved surfaces 156A is an upward curved surface with reference to a mid-section 158 of the first end 150A. In such examples, the curved elongated opening 156B is formed along the mid-section 158 of the first end 150A so as to separate the pair of first symmetrically curved surfaces 156A from one another. The second end 156B has a recess 156C. The body 150C has a pair of second symmetrically curved surfaces 156D and an opening 156E formed there between the first and second ends 150A, 156B respectively. For example, the opening 156E is formed proximate to the first end 150A. In the example of FIGS. 1A and 1B, each curved surface of the pair of second symmetrically curved surfaces 156D is an "S" shaped curved surface. In one or more examples, each lever of the pair of levers 150 may be made of a sheet metal.

In the example of FIGS. 1A and 1B, the grip rod 152 is a cylindrical component extending along the lateral axis 10. The grip rod 152 may have a pair of end caps 152A, each rotatably coupled to a corresponding end of the grip rod 152. In some examples, the grip rod 152 further includes a threaded through-hole 152B formed substantially at a midsection of the grip rod 152. In one or more examples, each end of the grip rod 152 may be inserted into a corresponding recess 156C of each lever 150, and the end cap 152A may be rotatably coupled to each end of the grip rod 152 so as to rotatably couple the grip rod 152 to the pair of levers 150. In some examples, the knob 154 includes a threaded shaft 154A, and a support section 154B coupled to the threaded shaft 154A. In such examples, the threaded shaft 154A may be inserted into the threaded through-hole 152B of the grip rod 152 so as to couple the knob 154 to the grip rod 152. The threaded shaft 154A may be further inserted into one of the first threaded recess (not shown) of the front panel 114 or the second threaded recess 141 of the back panel 116 so as to detachably couple the handle assembly 110 to the housing 108.

In one or more examples, the grip rod 152 is coupled to the pair of levers 150 to form the handle assembly 110. Further, the handle assembly 110 is pivotably connected to the housing 108, as discussed herein above, to form the dual-sided fan tray assembly 102. For example, the opening 156E of each lever of the pair of levers 150, is detachably coupled to the pivot pin 148 of each side wall of the pair of side walls 112 so as to pivotably connect the handle assembly 110 to the housing 108. In such examples, the handle assembly 110 may be able to rotate from about "0" degrees to about "−180" degrees relative to a central axis 11 of rotation of the pivot pin 148. For example, the pair of levers 150 of the handle assembly 110 may be rotated to about "0" degrees relative to the central axis 11 of rotation of the pivot pin 148 such that the grip rod 152 of the handle assembly 110 faces the back panel 116 of the housing 108. Similarly, the pair of levers 150 of the handle assembly 110 may be rotated about "−180" degrees relative to the central axis 11 of rotation of the pivot pin 148 such that the grip rod 152 of the handle assembly 110 faces the front panel 114 of the housing 108. In one or more examples, the pair of stopper pins 146 in each side wall of the pair of side walls 112 may restrict the rotation of the pair of levers 150 of the handle assembly 110 from about "0" degrees to "180" degrees or from about "−180" degrees to about "0" degrees relative to the central axis 11 of rotation of the pivot pin 148.

Figure 2:
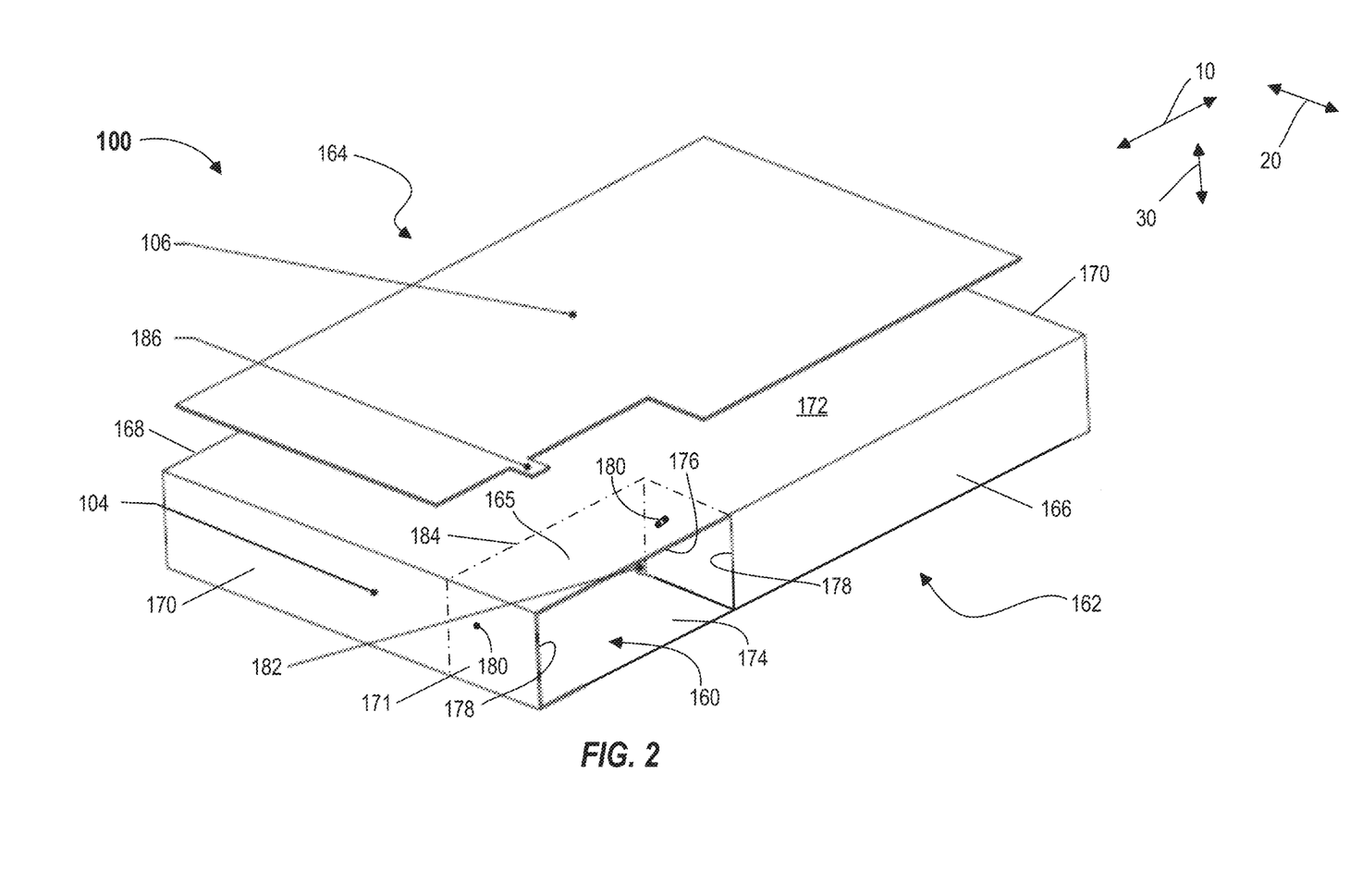
FIG. 2 illustrates an exploded perspective view of another portion of an electronic system including a chassis and a circuit board according to an example implementation of the present disclosure.

FIG. 2 depicts an exploded perspective view of another portion of an electronic system 100 including a chassis 104 and a circuit board 106. In some examples, the chassis 104 is a box shaped component. In one or more examples, the chassis 104 includes a first panel 166, a second panel 168, a pair of walls 170, a base (not shown), and a lid 172, which are coupled to each other to define an enclosure there between. The first panel 166 and/or the second panel 168 may include a plurality of network connector sockets (not shown), for example, a PCIe socket, Ethernet socket, or the like to connect electronic devices in the electronic system 100 to the destination devices in order to receive and forward data there between. Further, each of the plurality of network connector sockets may be communicatively coupled to the circuit board 106.

The chassis 104 may have at least one receptacle 160 located at a rear side 162 of the chassis 104 for receiving a removable component, for example, a dual-sided fan tray assembly 102 of FIG. 1B. In some examples, the chassis 104 may have another receptacle (not shown) located at a front side 164 of the chassis 104. Further, the receptacle 160 may be coupled to a portion of the chassis 104 from the rear side 162. In some examples, the receptacle 160 is an open box-shaped enclosure having a base 174, a lid 165, and a pair of peripheral side walls 171. In such examples, each peripheral side wall of the pair of peripheral side walls 171 may include a protrusion 180. Even though not illustrated in FIGS. 1A and 1B, the pair of peripheral side walls 171 includes a pair of protrusions 180. In some examples, the protrusion 180 may extend inwards relative to the chassis 104, and along the lateral axis 10. In some examples, the protrusion 180 may be coupled to each peripheral side wall 171 via suitable coupling mechanism, such as riveting, welding, fasteners, or the like. In some other examples, the protrusion 180 may be merged to the peripheral side wall 171 to form an integrated peripheral side wall. In some examples, the chassis 104 may be made of a sheet metal.

In one or more examples, the dual-sided fan tray assembly 102 (as shown in FIG. 1B) may be slidably inserted into, and detachably coupled to the receptacle 160 of the chassis 104. The steps/process of slidably inserting and detachably coupling the dual-sided fan tray assembly 102 to the chassis 104 of the electronic system 100 are discussed in greater details below.

In some examples, the chassis 104 may further include an electromagnetic induction (EMI) gasket or an electrostatic discharge (ESD) gasket 182 coupled along a perimeter 184 of an end portion of receptacle 160. In such examples, the EMI or ESD gasket 182 may protect the tray components inside the dual-sided fan tray assembly 102 (when slidably inserted inside the receptacle 160) from electromagnetic or electrostatic interference.

In one or more examples, the circuit board 106 may be coupled to the bottom of the chassis 104. In some examples, the circuit board 106 is a printed circuit board, which may include traces embedded in a semiconductor body (not labeled) of the circuit board 106, and connected to the plurality of network connector sockets disposed on the first panel 166 and/or the second panel 168 of the chassis. The circuit board 106 may include a plurality of electronic devices (not shown) coupled to the semiconductor body. In some examples, the plurality of electronic devices includes a processor, capacitors, resistors, or the like. Further, the circuit board 106 may have a third connector 186 disposed facing the receptacle 160. In some examples, the third connector is a male connector plug, for example, a PCIe connector plug.

Figure 3:
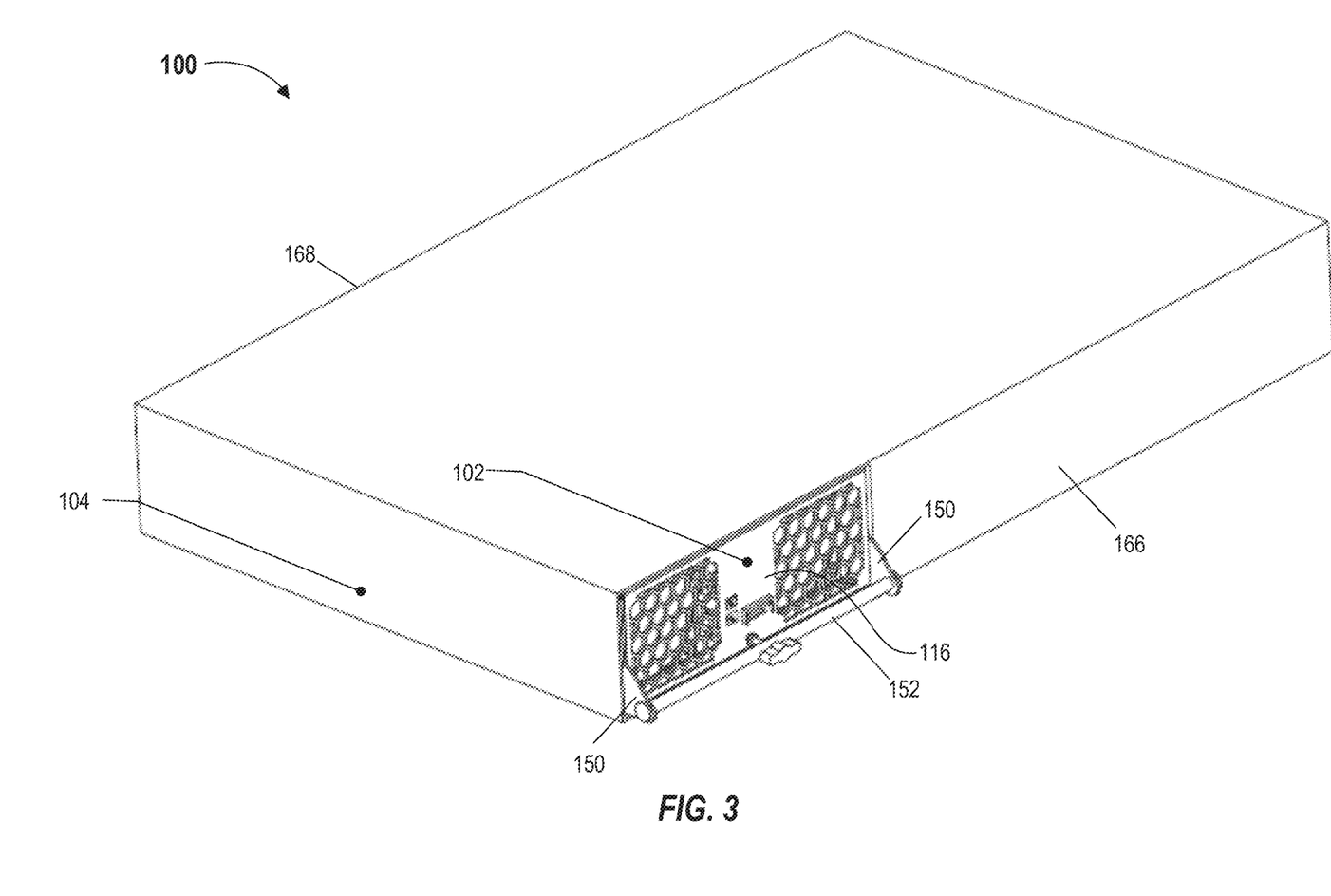
FIG. 3 illustrates an electronic system according to an example implementation of the present disclosure.

FIG. 3 depicts an electronic system 100 having a dual-sided fan tray assembly 102, a chassis 104, and a circuit board 106 (as shown in FIG. 2). As discussed hereinabove in the example of FIG. 2, the circuit board 106 may be coupled to a bottom of the chassis 104. Further, the dual-sided fan tray assembly 102 is slidably inserted into the chassis 104, (for example, into the receptacle 160) such that the back panel 116 of the dual-sided fan tray assembly 102 is aligned with the first panel 166 of the chassis 104 along a same plane. In the example of FIG. 3, the front panel 114 faces the first panel 166 while slidably inserting the dual-sided fan tray assembly 102 into the receptacle 160 of the chassis 104, and the front panel 114 is disposed within the chassis 104 after the dual-sided fan tray assembly 102 is slidably inserted into the receptacle 160 of the chassis 104.

Figure 5A:
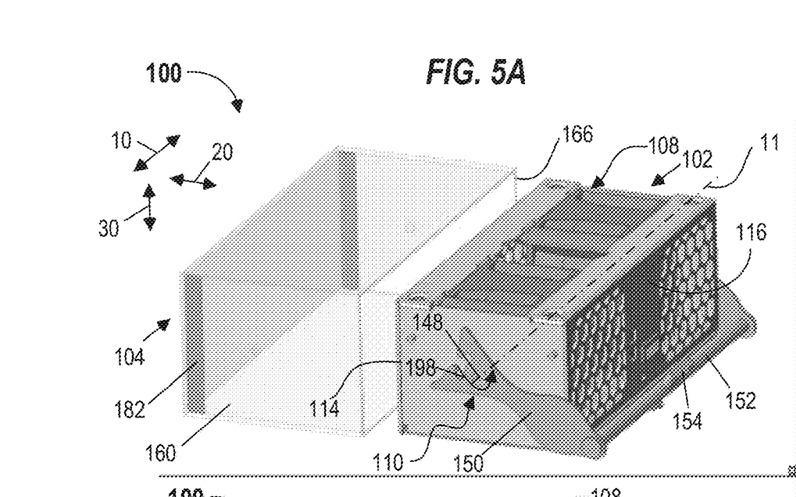
FIG. 5A-5H illustrate a plurality of steps of normal installation of a dual-sided fan tray assembly into a chassis of an electronic system according to an example implementation of the present disclosure.
Figure 5B:
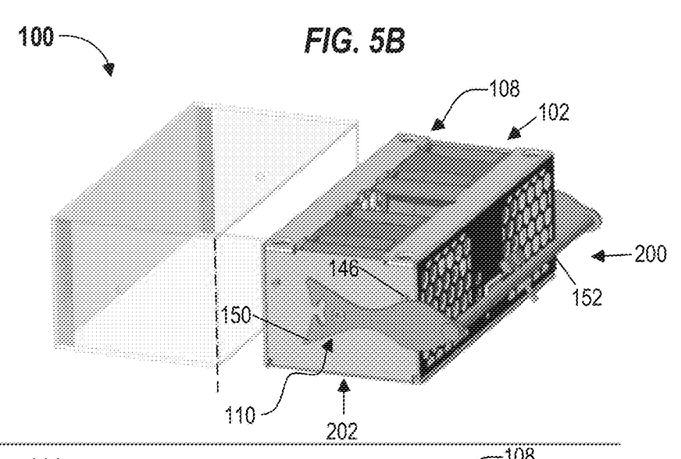
Figure 6A:
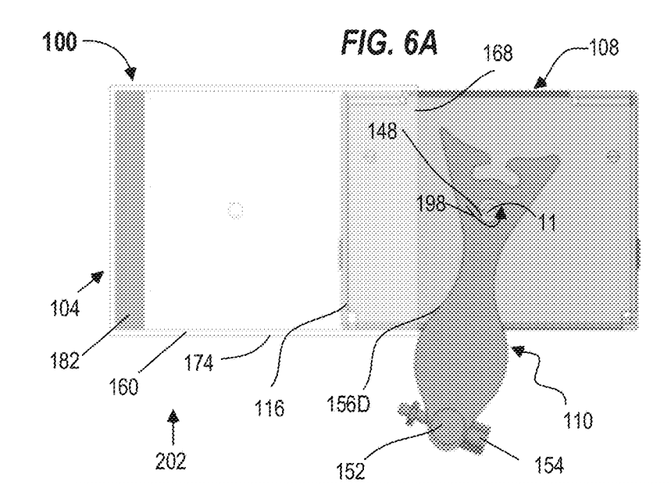
FIG. 6A-6L illustrate a plurality of steps of self-aligned installation of a dual-sided fan tray assembly into a chassis of an electronic system according to an example implementation of the present disclosure.
Figure 6B:
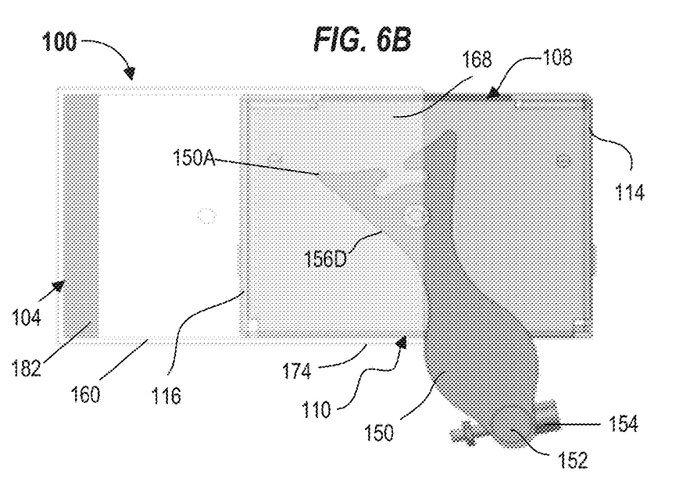
Figure 6C:
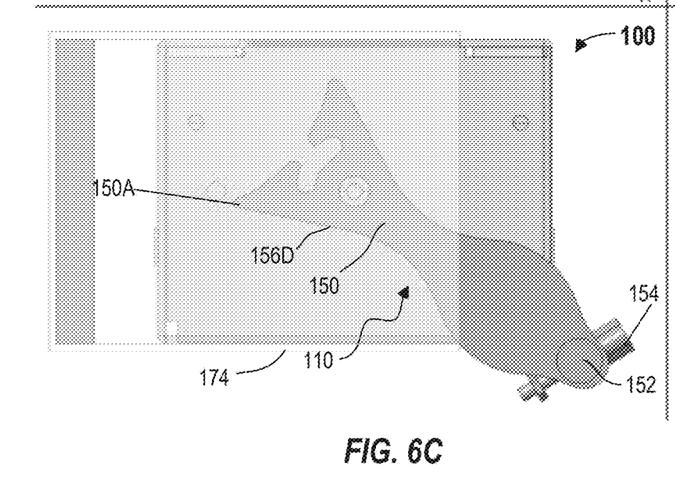
Figure 6D:
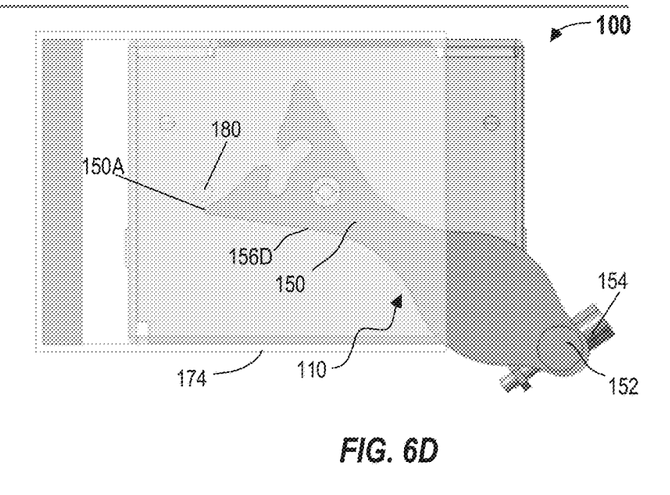
Figure 6E:
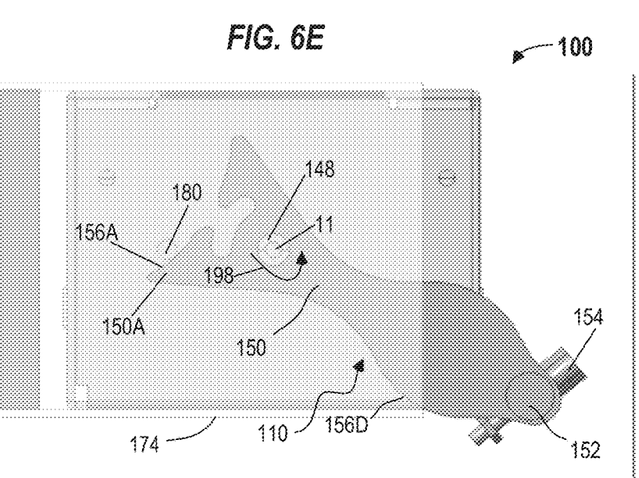
Figure 6F:
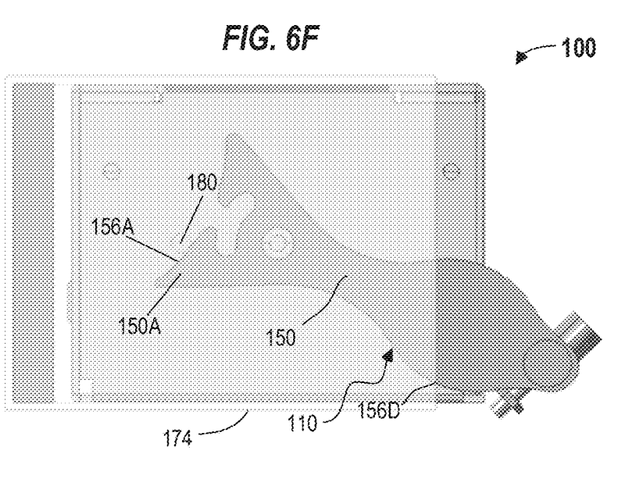
Figure 6G:
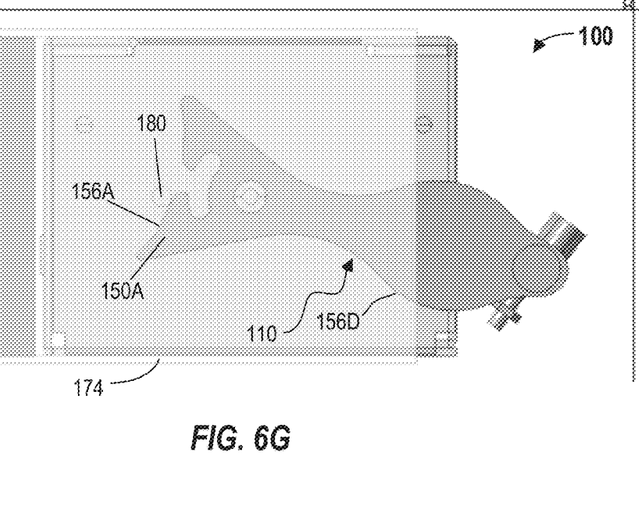
Figure 6H:
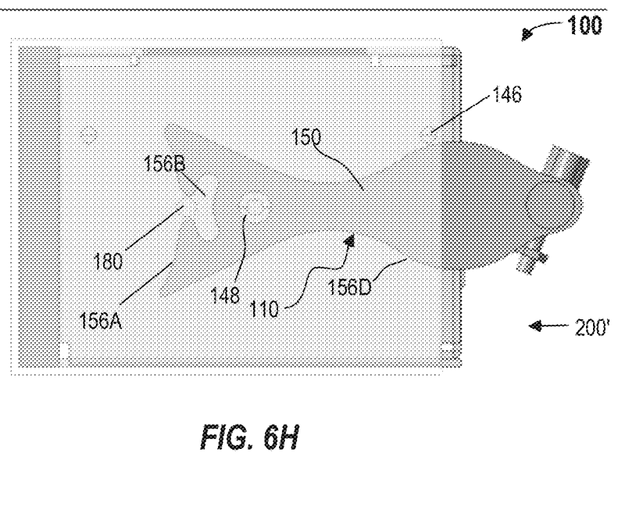

In some examples, the handle assembly 110 may be manually rotated to at least a first position 200 (as shown in FIG. 5B) or a second position 200' (as shown in FIG. 6H) before slidably inserting the dual-sided fan tray assembly 102 into the chassis 104. Thus, such an installation step/process may be referred to as a normal installation of the dual-sided fan tray assembly 102. In some other examples, the handle assembly 110 may be rotated to at least the first position 200 or the second position 200' by the chassis 104 while the dual-sided fan tray assembly is slidably inserted into the chassis 104. Thus, such an installation step/process may be referred to as self-aligned installation of the dual-sided fan tray assembly 102. In one or more examples, the first position 200 or the second position 200' may represent a position of the handle assembly 110 relative to the central axis 11 of rotation of the pivot pin 148.

In some examples, the handle assembly 110 is construed to be rotated to the first position 200, when the pair of levers 150 (as shown in FIGS. 1A and 1B) is rotated to about "0" degrees relative to the central axis 11 of rotation of the pivot pin 148 (as shown in FIGS. 1A and 1B), and the grip rod 152 is disposed facing the back panel 116. In such examples, the first connector 120 of the dual-sided fan tray assembly 102 is detachably coupled to the third connector 186 of the circuit board 106 so as to enable the plurality of fans 124 (as shown in FIGS. 1A and 1B) to operate as a suction fan for providing a thermal management solution to the electronic system 100.

In some other examples, the handle assembly 110 is construed to be rotated to the second position 200', when the pair of levers 150 is rotated to about "−180" degree relative to the central axis 11 of rotation of the pivot pin 148 and the grip rod 152 is disposed facing the front panel 114. In such examples, the second connector 122 of the dual-sided fan tray assembly 102 is detachably coupled to the third connector 186 of the circuit board 106 so as to enable the plurality of fans 124 (as shown in FIGS. 1A and 1B) to operate as a blower fan for providing a thermal management solution to the electronic system 100.

Figure 4A:
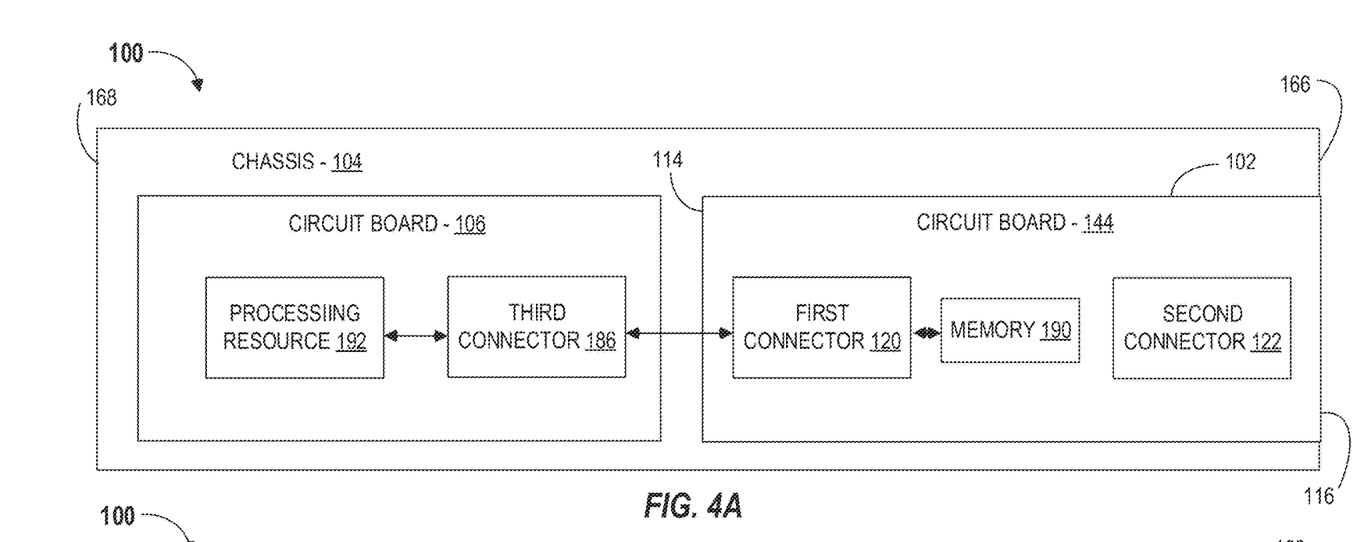
FIG. 4A illustrates a block diagram of an electronic system having a first connector of a dual-sided fan tray assembly connected to a third connector of a circuit board according to an example implementation of the present disclosure.

FIG. 4A depicts a block diagram of an electronic system 100 having a dual-sided fan tray assembly 102 slidably inserted into a chassis 104. As discussed herein above, the dual-sided fan tray assembly 102 includes a circuit board 144 having a first connector 120, a second connector 122, and a memory 190. In one or more examples, the memory 190 may be an electrically erasable programmable read-only memory (EEPROM). In some examples, the memory 190 is communicatively coupled to the first connector 120 so as to provide a data (i.e., a static signal), which is representative of 3.3 volts electrical signal. However, the memory 190 is not communicatively coupled to the second connector 122. Similarly, the circuit board 106 of the electronic system 100 may include a third connector 186 and a processing resource 192 communicatively coupled to the third connector 186.

In one or more examples, when the dual-sided fan tray assembly 102 is slidably inserted into the chassis 104 with the front panel 114 of the dual-sided fan tray assembly 102 facing the first panel 166 of the chassis 104, the first connector 120 is detachably coupled to the third connector 186. In such examples, after the third connector 186 is coupled to the first connector 120, the processing resource 192 may access an address of the memory 190 via the third and first connectors 186, 120 respectively, so as to receive the data (i.e., the static signal which represents the electrical signal of about 3.3 volts) from the memory 190. Thus, the processing resource 192 may be able to determine that the dual-sided fan tray assembly is installed with the front panel 114 facing the first panel 166 of the chassis 104. Further, the processing resource 192 may generate a command signal to the plurality of fans 124 (as shown in FIG. 1A) to operate as a suction fan and indicate the user of the electronic system 100 about the function of the plurality of fans 124 and the orientation of the dual-sided fan tray assembly 102 within the chassis 104. In such examples, the plurality of fans 124 may draw a coolant air from an interior space of the chassis 104 and discharge it to an external environment (not labeled) sequentially via the front panel 114 and the back panel 116. In other words, the plurality of fans 124 may first draw the coolant air from the external environment into an interior space of the chassis 104 via a second panel 168 of the chassis 104 in order to absorb waste-heat generated by the circuit board 106, and the plurality of electronic devices, such as the processors, the capacitors, the resistors, or the like, and generate a substantially hot air. Later, the plurality of fans 124 may draw the hot air from the interior space of the chassis 104 into the dual-sided fan tray assembly 102 via the front panel 114, and discharge the hot air from the dual-sided fan tray assembly 102 into the external environment via the back panel 116.

Figure 4B:
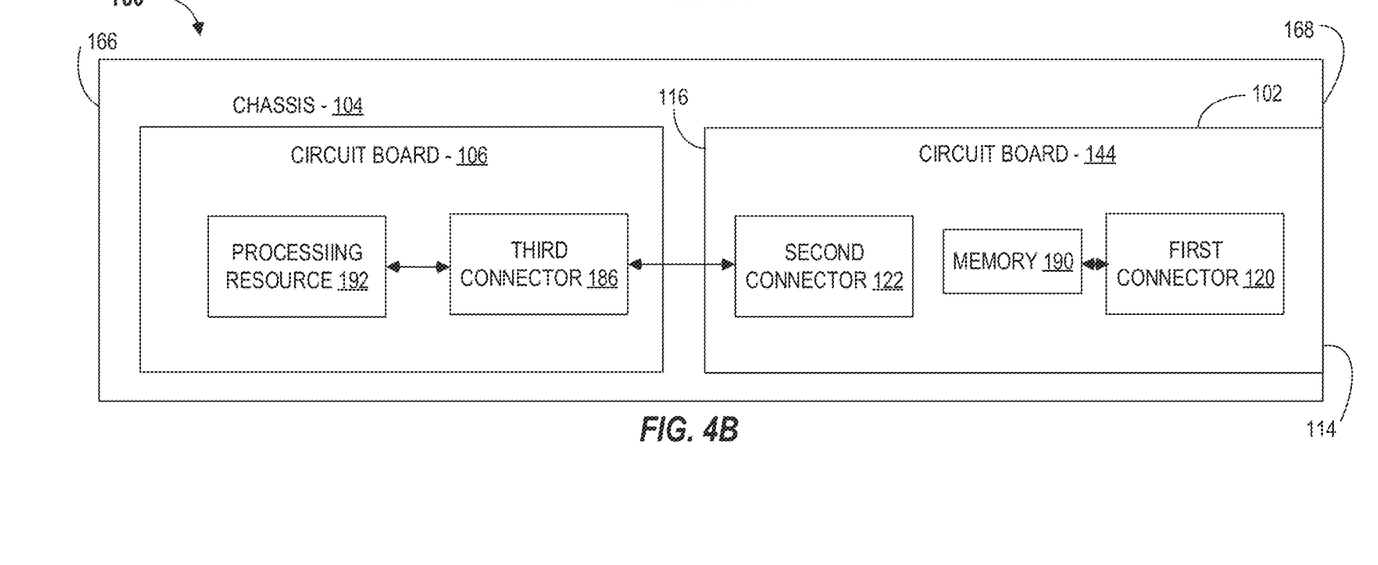
FIG. 4B illustrates a block diagram of an electronic system having second connector of a dual-sided fan tray assembly connected to a third connector of a circuit board according to an example implementation of the present disclosure.

FIG. 4B depicts a block diagram of an electronic system 100 having a dual-sided fan tray assembly 102 slidably inserted into a chassis 104. As discussed herein above in the example of FIG. 4A, the dual-sided fan tray assembly 102 includes a circuit board 144 having a first connector 120, a second connector 122, and a memory 190. In some examples, the memory 190 is communicatively coupled to the first connector 120. However, the memory 190 is not communicatively coupled to the second connector 122. Similarly, the circuit board 106 of the electronic system 100 may include a third connector 186 and a processing resource 192 communicatively coupled to the third connector 186.

In one or more examples, when the dual-sided fan tray assembly 102 is slidably inserted into the chassis 104 with the back panel 116 of the dual-sided fan tray assembly 102 facing the second panel 168 of the chassis 104, the second connector 122 is detachably coupled to the third connector 186. In such examples, after the third connector 186 is coupled to the second connector 122, the processing resource 192 may try to access the address of the memory 190 via the third and second connectors 186, 122 respectively, so as to receive the data (i.e., the static signal which represents the electrical signal of about 3.3 volts) from the memory 190. Since, the second connector 122 is not communicatively coupled to the memory 190, the processing resource 192 may not be able to obtain the data from the memory. Accordingly, the processing resource 192 may generate a command signal to the plurality of fans 124 (as shown in FIG. 1A) to operate as a blower fan and indicate the user of the electronic system 100 about the function of the plurality of fans 124 and the orientation of the dual-sided fan tray assembly 102 within the chassis 104. In such examples, the plurality of fans 124 may draw a coolant air from an external environment into the chassis 104 sequentially via the front panel 114 and the back panel 116. In other words, the plurality of fans 124 may first draw the coolant air from the external environment into the dual-sided fan tray assembly 102 via the front panel 114, and direct the coolant air from the dual-sided fan tray assembly 102 into the interior space of the chassis 104 via the back panel 116. The coolant air may then absorb the waste-heat generated by the circuit board 106, and the plurality of electronic devices, such as the processors, the capacitors, the resistors, or the like, and generate a substantially hot air, and subsequently the hot air is discharged to the external environment via the first panel 166.

FIGS. 5A-5H depict a plurality of normal steps of installing a dual-sided fan tray assembly 102 into a chassis 104 of an electronic system 100. It may be noted herein that the plurality of steps as depicted in FIGS. 5A-5H are described in conjunction with FIGS. 1A, 1B, 2, and 3, for example. The electronic system 100 includes the dual-sided fan tray assembly 102, the chassis 104, and a circuit board 106 (as shown in FIG. 2). Further, it may be noted herein that the plurality of steps as depicted in FIGS. 5A-5H are shown without the circuit board 106 for the purpose of ease of illustration, and such examples should not be construed as a limitation of the present disclosure. Similarly, the plurality of steps as depicted in FIGS. 5A-5H show only a receptacle 160 of the chassis 104 for the purpose of ease of illustration and such examples should not be construed as limitation of the present disclosure. Further, the chassis 104 is shown as a transparent structure to depict movement of a housing 108 and a handle assembly 110 of the dual-sided fan tray assembly 102.

Figure 5C:
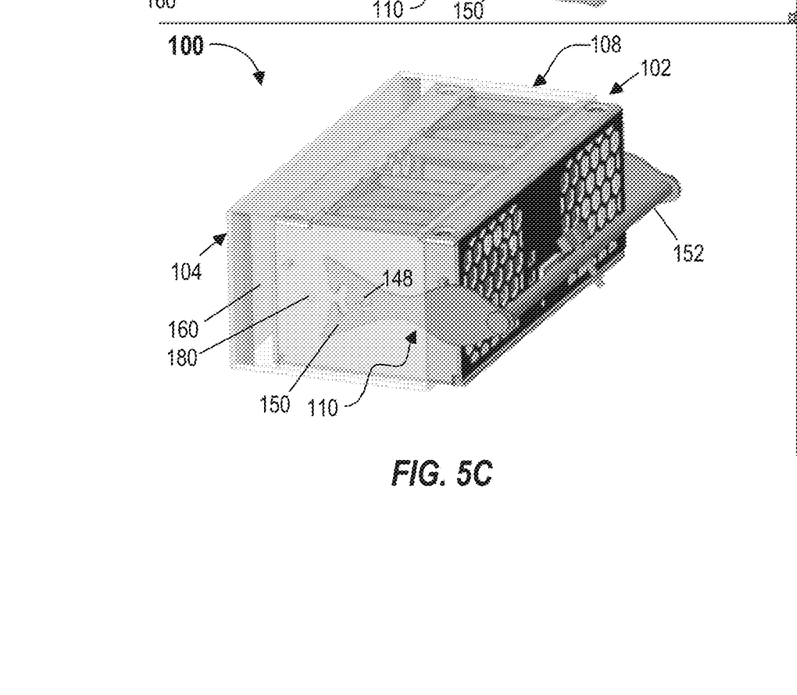
Figure 5D:
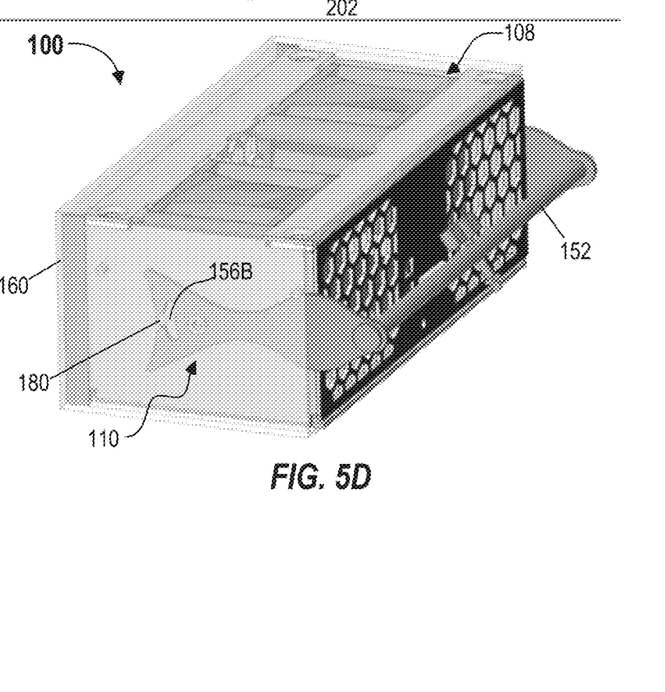
Figure 5E:
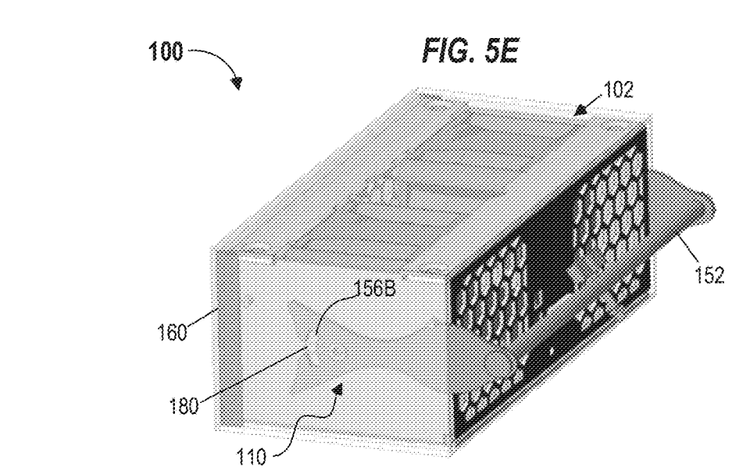
Figure 5F:
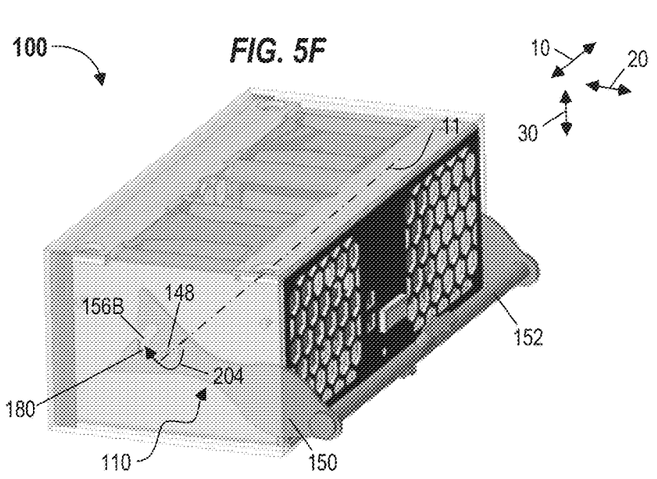
Figure 5G:
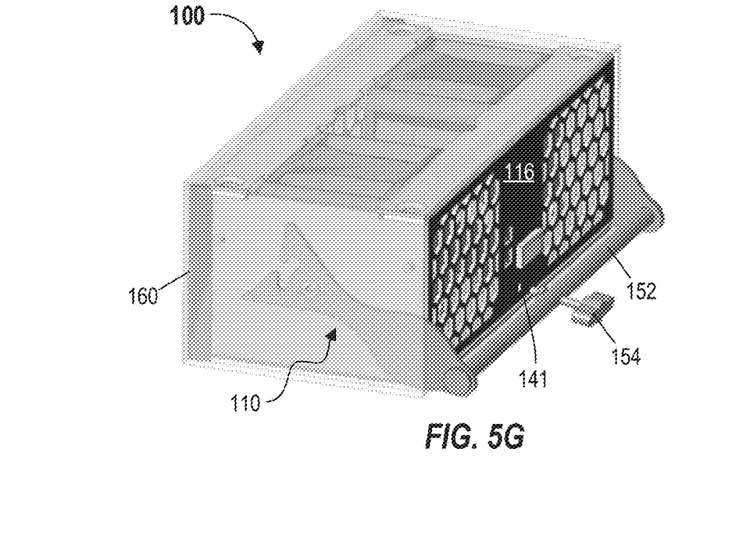
Figure 5H:
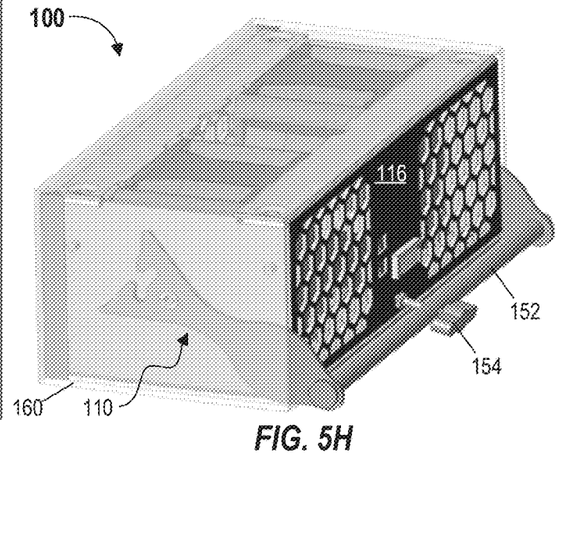

Referring to FIG. 5A, the receptacle 160 of the chassis 104, and the dual-sided fan tray assembly 102 are disposed spaced apart from one another. In particular, the dual-sided fan tray assembly 102 is disposed with the front panel 114 facing the first panel 166 of the chassis 104. In such examples, during the normal installation, the handle assembly 110 is manually rotated along a first direction 198 (for example, along an anti-clockwise direction) relative to the central axis 11 of rotation of the pivot pin 148, to shift the handle assembly 110 from a third position 202 (shown in FIG. 5B) to the first position 200 (shown in FIG. 5B). For example, a grip rod 152 of the handle assembly 110 is moved upwards along a radial axis 30 to move the handle assembly 110 from the third position 202 to the first position 200. It may be noted herein that the third position 202 may represent a resting position of the handle assembly 110 due to force, such as gravity. In one or more examples, the handle assembly 110 may be manually rotated along the first direction 198 until a stopper pin 146 of the housing 108, restricts the rotation of a lever 150 of the handle assembly 110. In such examples, the handle assembly 110 may have been rotated from about "-90" degrees (i.e., referring to the third position 202) to about "0" degrees (i.e., referring to the first position 200) relative to the central axis 11 of rotation of the pivot pin 148 to shift the handle assembly 110 from the third position 202 to the first position 200, as shown in FIG. 5B. In such examples, the handle assembly 110 is held (retained) in the first position 200, and the housing 108 of the dual-sided fan tray assembly 102 is slidably inserted into the receptacle 160 of the chassis 104, as shown in FIG. 5C. The dual-sided fan tray assembly 102 may be further inserted until a curved elongated opening 156B of the lever 150 receives a protrusion 180 of the chassis 104, as shown in FIG. 5D. The protrusion 180 may restrict the further insertion of the dual-sided fan tray assembly 102 into the chassis 104, as shown in FIG. 5E. For example, the protrusion 180 may block a further insertion (movement) of the dual-sided fan tray assembly 102 into the chassis 104, as the curved elongated opening 156B gets blocked by the protrusion 180, as shown in FIG. 5E. Thus, the protrusion 180 may restrict further movement of the dual-sided fan tray assembly 102 along the longitudinal axis 20 and the lateral axis 10. The handle assembly 110 is later rotated along a second direction 204 (i.e., from the first position 200 towards the third position 202, for example, along a clockwise direction) relative to the central axis 11 of rotation of the pivot pin 148, by pushing the grip rod 152 downwards along the radial axis 30, so as to detachably couple the corresponding protrusion 180 to the curved elongated opening 156B. Thereby, securing the dual-sided fan tray assembly 102 within the chassis 104, as shown in FIG. 5F. In some examples, the handle assembly 110 may have rotated to about "-15" degrees along the second direction 204 to secure the dual-sided fan tray assembly 102 within the chassis 104. Further, the grip rod 152 is rotated so as to align the knob 154 with a second threaded recess 141 in the back panel 116, as shown in FIG. 5G. Later, the grip rod 152 is detachably coupled to the back panel 116 via the knob 154 for further restricting the movement of the dual-sided fan tray assembly 102 along a radial axis 30, as shown in FIG. 5H.

In some other examples, the dual-sided fan tray assembly 102 may be slidably inserted into the chassis 104, when the back panel 116 of the dual-sided fan tray assembly 102 is facing the second panel 168 of the chassis 104. In such examples, the handle assembly 110 may be first rotated to a second position 200' (refer FIG. 6H) before slidably inserting the dual-sided fan tray assembly 102 into the chassis of the electronic system 100, as discussed in the examples of FIGS. 5C-5H.

FIGS. 6A-6L depict a plurality of steps of self-aligned installation of a dual-sided fan tray assembly 102 into a chassis 104 of an electronic system 100. It may be noted herein that the plurality of steps as depicted in FIGS. 6A-6L are described in conjunction with FIGS. 1A, 1B, 2, and 3, for example. The electronic system 100 includes the dual-sided fan tray assembly 102, the chassis 104, and a circuit board 106 (as shown in FIG. 2). Further, it may be noted herein that the plurality of steps as depicted in FIGS. 6A-6L are shown without the circuit board 106 for the purpose of ease of illustration, and such examples should not be construed as a limitation of the present disclosure. Similarly, the plurality of steps as depicted in FIGS. 6A-6L show only a receptacle 160 of the chassis 104 for the purpose of ease of illustration and such examples should not be construed as limitation of the present disclosure. Further, the chassis 104 is shown as a transparent structure to depict movement of a housing 108 and a handle assembly 110 of the dual-sided fan tray assembly 102.

Figure 6I:
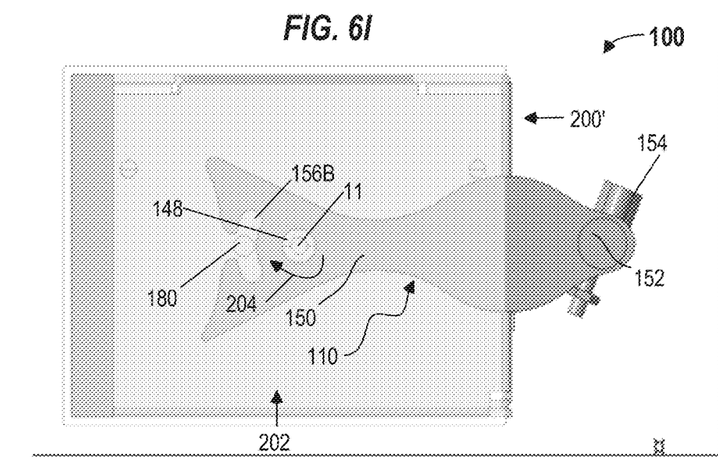
Figure 6J:
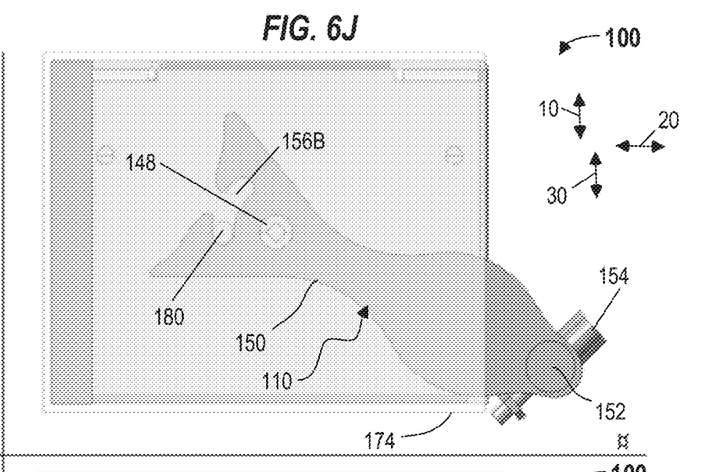
Figure 6K:
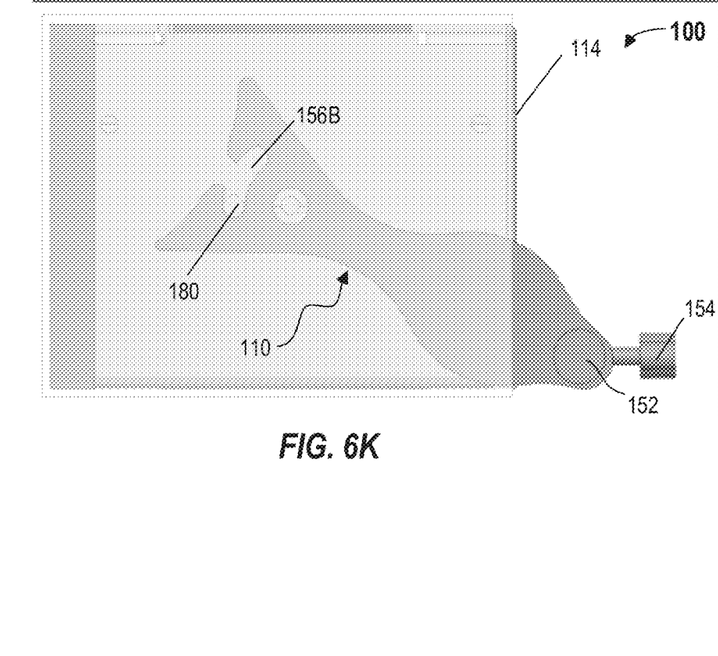
Figure 6L:
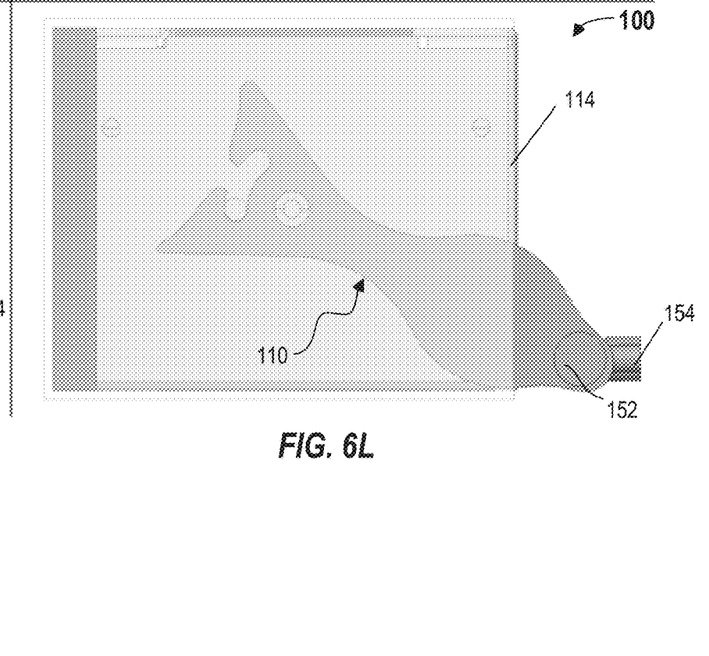

Referring to FIG. 6A, the dual-sided fan tray assembly 102 is disposed with the back panel 116 facing the second panel 168 of the chassis 104. Further, the dual-sided fan tray assembly 102 is slidably inserted into the chassis 104 while the handle assembly 110 is in a third position 202. In such examples, during the self-aligned installation process, the handle assembly 110 is initially rotated along a first direction 198, for example, along an anti-clockwise direction relative to the central axis 11 of rotation of the pivot pin 148, by the base 174 of the chassis 104 so as to gradually shift the handle assembly 110 from the third position 202, until it reaches the second position 200' (as shown in FIG. 6H). In particular, a second symmetrical surface 156D of a lever 150 of the handle assembly 110 contacts the base 174 of the chassis 104 as the dual-sided fan tray assembly 102 is slidably inserted into chassis 104, thereby causing the second symmetrical curved surface 156D to slide in relation to the base 174 resulting in the handle assembly 110 to gradually rotate along the first direction 198, as shown in FIGS. 6B-6C. In such examples, the first end 150A of the lever 150 approaches the protrusion 180 of the chassis 104, as the dual-sided fan tray assembly 102 is gradually inserted into the chassis 104. Further referring to FIGS. 6E-6G, the slidable insertion of the dual-sided fan tray assembly 102 causes a first symmetrical curved surface 156A of the lever 150 to slide relative to the protrusion 180, and the second symmetrical curved surface 156D of the lever 150 to slide relative to the base 174, resulting in the handle assembly 110 to continue rotating along the first direction 198 for shifting the handle assembly 110 from the third position 202, until it reaches the second position 200' (as shown in FIG. 6H). Further, referring to FIG. 6H, the curved elongated opening 156B of the lever 150 receives the protrusion 180, when the handle assembly is shifted to the second position 200'. The handle assembly 110 may be rotated until a stopper pin 146 of the housing 108, restricts the rotation of a lever 150 of the handle assembly 110. In such examples, the handle assembly 110 may have been rotated to from about "−90" degrees to "−180" degrees relative to the central axis 11 of rotation of the pivot pin 148 to shift from the third position 202 to the second position 200', as shown in FIG. 6H. In such examples, the protrusion 180 may further restrict slidable insertion (movement) of the dual-sided fan tray assembly 102 into the chassis 104, as shown in FIG. 6I. For example, the protrusion 180 may block a further movement of the dual-sided fan tray assembly 102 into the chassis 104, as the curved elongated opening 156B gets blocked by the protrusion 180. Thus, the protrusion 180 may restrict further movement of the dual-sided fan tray assembly 102 along the longitudinal axis 20 and the lateral axis 10. The handle assembly 110 is later rotated along a second direction 204 (i.e., from the second position 200' towards the third position 202, for example, along a clockwise direction) relative to the central axis 11 of rotation of the pivot pin 148, by pushing the grip rod 152 downwards along the radial axis 30, so as to detachably couple the corresponding protrusion 180 to the curved elongated opening 156B. Thus, securing the dual-sided fan tray assembly 102 within the chassis 104, as shown in FIG. 6I-6J. In some examples, the handle assembly 110 may have rotated to about "−165" degrees along the second direction 204 to secure the dual-sided fan tray assembly 102 within the chassis 104. Further, the grip rod 152 is rotated so as to align the knob 154 with a threaded recess (not shown) in the front panel 114, as shown in FIG. 6K. Later, the grip rod 152 is detachably coupled to the front panel 114 via the knob 154 for further restricting the movement of the dual-sided fan tray assembly 102 along a radial axis 30, as shown in FIG. 6L.

Various features as illustrated in the examples described herein may be implemented in a system, such as an electronic system having a dual-sided fan tray assembly. The dual-sided fan try assembly may be installed through any one of dual-sides of the fan tray assembly. Thus, the dual-sided fan tray assembly is modular in nature, allowing the user not to have two directly oriented fan tray assembly to install into the chassis of the electronic system. Thereby significantly reducing the inconvenience, and the cost escalations to the users. Further, the processing resource maybe able to provide information regarding the way the fan tray assembly is installed into the electronic system and the way a plurality of fan operates. Thereby, allowing the user to make corrections to the orientations of the fan tray assembly, if it is been determined that the fan tray assembly has been wrongly orientated, when it is installed in the electronic system.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A dual-sided fan tray assembly comprising:
   a housing comprising a front panel, a back panel, and a pair of side walls coupled to the front panel and the back panel;
   a first connector and a second connector disposed within the housing such that the first connector faces the front panel and the second connector faces the back panel, wherein one of the first or second connectors is detachably coupled to a third connector of an electronic system when the dual-sided fan tray assembly is slidably inserted into a chassis of the electronic system; and
   a handle assembly pivotably connected to the pair of side walls such that the handle assembly is at least rotatable around the housing to at least first and second positions spaced apart from each other, wherein when the handle assembly is rotated to the first position, the dual-sided fan tray assembly is slidably insertable into the chassis of the electronic system with the front panel facing the chassis to install the dual-sided fan tray assembly to the electronic system, and wherein when the handle assembly is rotated to the second position, the dual-sided fan tray assembly is slidably insertable into the chassis of the electronic system with the back panel facing the chassis to install the dual-sided fan tray assembly to the electronic system.

2. The dual-sided fan tray assembly of claim 1, wherein the handle assembly comprises a pair of levers spaced apart from each other, and a grip rod connected to the pair of levers, wherein each lever comprises a first end, and a second end, wherein the first end has a pair of symmetrically curved surfaces, and a curved elongated opening located there between separating the pair of symmetrically curved surfaces, and wherein the second end is configured to be coupled to the grip rod.

3. The dual-sided fan tray assembly of claim 2, wherein the curved elongated opening of each lever is configured to receive a corresponding protrusion of a pair of protrusions in the chassis when the dual-sided fan tray assembly is slidably inserted into the chassis, to restrict further movement of the dual-sided fan tray assembly along a longitudinal axis and a lateral axis.

4. The dual-sided fan tray assembly of claim 3, wherein the handle assembly is further rotated from one of the first or second positions towards a third position to detachably couple the corresponding protrusion to the curved elongated opening of the lever.

5. The dual-sided fan tray assembly of claim 4, wherein the grip rod is detachably coupled to one of the front panel or the back panel to further restrict the movement of the dual-sided fan tray assembly along a radial axis.

6. The dual-sided fan tray assembly of claim 2, wherein each side wall of the housing comprises a pivot pin, and a pair of stopper pins disposed spaced apart from each other above the pivot pin, and wherein the pair of stopper pins restricts rotation of the handle assembly between "0" degrees to "−180" degrees relative to a central axis of rotation of the pivot pin.

7. The dual-sided fan tray assembly of claim 1, wherein the handle assembly is rotated from a third position to one of the first or second positions and retained in one of the first position or the second position, before the dual-sided fan tray assembly is slidably inserted into the chassis of the electronic system.

8. The dual-sided fan tray assembly of claim 1, wherein the handle assembly is rotated from a third position to one of the first or second positions by the chassis of the electronic system, when the dual-sided fan tray assembly is slidably inserted into the chassis of the electronic system.

9. The dual-sided fan tray assembly of claim 1, wherein the first connector is further connected to a memory of the dual-sided fan tray assembly, and wherein when the first connector is detachably coupled to the second connector, a processing resource of the electronic system is configured to receive a data from the memory via the first and third connectors for determining whether the dual-sided fan tray assembly is installed through the front panel or the back panel.

10. An electronic system comprising:
a chassis;
a dual-sided fan tray assembly detachably coupled to the chassis; wherein the dual-sided fan tray assembly comprises:
a housing comprising a front panel, a back panel, and a pair of side walls coupled to the front panel and the back panel;
a first connector and a second connector disposed within the housing such that the first connector faces the front panel and the second connector faces the back panel; and
a handle assembly pivotably connected to the pair of side walls such that the handle assembly is rotatable around the housing to at least first and second positions spaced apart from each other, wherein when the handle assembly is rotated to the first position, the dual-sided fan tray assembly is slidably insertable into the chassis with the front panel facing the chassis to install the dual-sided fan tray assembly to the electronic system, and wherein when the handle assembly is rotated to the second position, the dual-sided fan tray assembly is slidably insertable into the chassis with the back panel facing the chassis to install the dual-sided fan tray assembly to the electronic system; and
a circuit board disposed within the chassis, comprising a third connector facing the dual-sided fan tray assembly, wherein one of the first connector or second connector is detachably coupled to the third connector when the dual-sided fan tray assembly is slidably inserted into the chassis.

11. The electronic system of claim 10, wherein the handle assembly comprises a pair of levers spaced apart from each other, and a grip rod connected to the pair of levers, wherein each lever comprises a first end, and a second end, wherein the first end has a pair of symmetrically curved surfaces, and a curved elongated opening located there between separating the pair of symmetrically curved surfaces, and wherein the second end is configured to be coupled to the grip rod.

12. The electronic system of claim 11, wherein the curved elongated opening of each lever is configured to receive a corresponding protrusion of a pair of protrusions in the chassis when the dual-sided fan tray assembly is slidably inserted into the chassis, to further restrict movement of the dual-sided fan tray assembly along a longitudinal axis and a lateral axis.

13. The electronic system of claim 12, wherein the handle assembly is further rotated from one of the first or second positions towards a third position to detachably couple the corresponding protrusion to the curved elongated opening of the lever.

14. The electronic system of claim 13, wherein the grip rod is detachably coupled to one of the front panel or the back panel to further restrict the movement of the dual-sided fan tray assembly along a radial axis.

15. The electronic system of claim 11, wherein each side wall of the housing comprises a pivot pin, and a pair of stopper pins disposed spaced apart from each other above the pivot pin, and wherein the pair of stopper pins restricts rotation of the handle assembly between "0" degrees to "−180" degrees relative to a central axis of rotation of the pivot pin.

16. The electronic system of claim 10, wherein the handle assembly is rotated from a third position to one of the first or second positions and retained in one of the first or second positions, before the dual-sided fan tray assembly is slidably inserted into the chassis of the electronic system.

17. The electronic system of claim 10, wherein the handle assembly is rotated from a third position to one of the first or second positions by the chassis of the electronic system, when the dual-sided fan tray assembly is slidably inserted into the chassis of the electronic system.

18. The electronic system of claim 17, wherein the first connector is further connected to a memory of the dual-sided fan tray assembly, and wherein when the first connector is detachably coupled to the second connector, a processing resource of the electronic system is configured to receive a data from the memory via the first and third connectors for determining whether the dual-sided fan tray assembly is installed into the chassis with the front panel or the back panel facing the chassis.

19. A method comprising:
rotating a handle assembly of a dual-sided fan tray assembly around a housing of the dual-sided fan tray assembly, to one of first or second positions spaced apart from each other, wherein the handle assembly is pivotably connected to the housing;
slidably inserting the dual-sided fan tray assembly into a chassis of an electronic system, with one of a front panel or a back panel of the housing facing the chassis;
receiving a pair of protrusions in the chassis by a pair of curved elongated openings of the handle assembly to restrict further movement of the dual-sided fan tray assembly along a longitudinal axis and a lateral axis of the chassis;
detachably coupling the pair of protrusions to the pair of curved elongated openings by rotating the handle assembly from one of the first or second positions towards a third position; and
detachably coupling a grip rod of the handle assembly to one of the front panel or the back panel of the housing to further restrict the movement of the dual-sided fan tray assembly along a radial axis of the chassis.

* * * * *